United States Patent
Ibuka

(10) Patent No.: US 7,759,992 B2
(45) Date of Patent: Jul. 20, 2010

(54) CML CIRCUIT AND CLOCK DISTRIBUTION CIRCUIT

(75) Inventor: Hiroshi Ibuka, Tokyo (JP)

(73) Assignee: NEC Corporation, Tokyo (JP)

( * ) Notice: Subject to any disclaimer, the term of this patent is extended or adjusted under 35 U.S.C. 154(b) by 258 days.

(21) Appl. No.: 11/727,849

(22) Filed: Mar. 28, 2007

(65) Prior Publication Data
US 2007/0229131 A1 Oct. 4, 2007

(30) Foreign Application Priority Data
Mar. 30, 2006 (JP) ............................. 2006/094302

(51) Int. Cl.
*H03L 7/06* (2006.01)
(52) U.S. Cl. ...................... 327/158; 326/115
(58) Field of Classification Search ................. None
See application file for complete search history.

(56) References Cited

U.S. PATENT DOCUMENTS

| | | | | |
|---|---|---|---|---|
| 5,920,204 A * | 7/1999 | Bruno | ........................ | 326/86 |
| 6,028,454 A * | 2/2000 | Elmasry et al. | ............. | 326/115 |
| 6,762,624 B2 * | 7/2004 | Lai | ............. | 326/115 |
| 7,196,551 B2 * | 3/2007 | Lee | ............. | 326/115 |
| 7,199,604 B2 * | 4/2007 | Hecht et al. | ................... | 326/30 |
| 7,405,594 B1 * | 7/2008 | Xu | ............. | 326/82 |
| 2003/0038681 A1 * | 2/2003 | Djafari et al. | ............... | 331/1 A |
| 2005/0248382 A1 * | 11/2005 | Chung et al. | ................ | 327/362 |

FOREIGN PATENT DOCUMENTS

| | | |
|---|---|---|
| JP | 2002-368600 | 12/2002 |
| JP | 2004-96750 | 3/2004 |

* cited by examiner

Primary Examiner—Cassandra Cox
(74) Attorney, Agent, or Firm—McGinn IP Law Group, PLLC

(57) ABSTRACT

A clock distribution circuit according to an exemplary aspect of the present invention comprises a drive power boost signal generator which generates and outputs a drive power boost signal, and a CML circuit which outputs a first signal combined by a second signal when the drive power boost signal indicates active state and outputs the first signal when the drive power boost signal indicates an inactive state.

19 Claims, 5 Drawing Sheets

CML CIRCUIT AND CLOCK DISTRIBUTION CIRCUIT

This application is based upon and claims the benefit of priority from Japanese patent application No. 2006-094302, filed on Mar. 30, 2006, the disclosure of which is incorporated herein in its entirety by reference.

BACKGROUND OF THE INVENTION

1. Field of the Invention

The present invention relates to a CML (current mode logic) circuit and a clock distribution circuit utilizing the CML circuit.

2. Description of the Related Art

High speed serial transmission (including SerDes {serialization/deserialization}) requires a high-frequency clock. The jitter generated during the clock distribution, which adversely affects the transmission error rate, must be reduced. Therefore, in recent years CML circuits made up of MOS (Metal Oxide Semiconductors) are being utilized as clock drivers. They are capable of high-speed operation at a small amplitude and resistant to the effects of power supply noise.

CML circuits using MOS can be fabricated with the same process as other MOS circuits. That gives advantage in terms of layout to the CML circuits using MOS. However, CML circuits when made up of MOS possess low gain and large capacitance compared to bipolar circuits. So, if utilized as a clock driver, a large amplitude signal must be input to the input terminal of each clock driver stage in order to maintain amplitude of clocks sent to each circuit or device.

The output impedance of the CML circuit used as the clock driver must therefore be lowered and the drive power must be boosted when driving circuits or devices connected by long-distance wiring at a high-speed clock frequency. However a fixed current flows constantly in the CML circuit regardless of whether it is operating or not, so lowering the output impedance causes the problem that power consumption drastically increases.

In recent years, power supply voltages of circuits and threshold voltages (Vth) of transistors have dropped because MOS oxide films have become thinner and circuits have become minuter with higher circuit densities. The drop causes increasingly adverse effects when maximum device ratings cannot be met. The adverse effects, as described in the patent documents below, result in severe problems such as faulty logic circuit operation due to ringing, and deterioration or destruction of the MOS due to overshoot or undershoot. The ringing in the clock waveform that occurs due to excessive drive power must therefore be reduced.

[Patent document 1] Japanese Unexamined Patent Publication No. 2002-368600

[Patent document 2] Japanese Unexamined Patent Publication No. 2004-096750

Moreover, in clock drivers made up of CML circuits used for high-frequency (RF) clock distribution, failure of the first period clock wave to form due to effects of the RC components in clock wiring or the next stage of the clock driver must be prevented. Such failure occurs when resuming clock operation from a stopped clock state such as when turning on the power or clock gating. Also the power supply noise and power consumption during normal operation and low speed test operation must be reduced.

SUMMARY OF THE INVENTION

A clock distribution circuit according to an exemplary aspect of the present invention comprises a drive power boost signal generator which generates and outputs a drive power boost signal, and a CML circuit which outputs a first signal combined by a second signal when the drive power boost signal indicates active state and outputs the first signal when the drive power boost signal indicates an inactive state.

A clock distribution method according to an exemplary aspect of the present invention comprises outputting a drive power boost signal, outputting a first signal combined by a second signal, outputting the first signal according to an input signal regardless of a state which the drive power boost signal indicates, and outputting the second signal according to the input signal when the drive power boost signal indicates active state but not outputting the second signal when the drive power boost signal indicates an inactive state.

According to an exemplary aspect of the present invention, the drive power can be increased by combining the first signal and the second signal when the drive power boost signal indicates active state and can be decreased by outputting the first signal when the drive power boost signal indicates an inactive state.

DETAILED DESCRIPTION OF THE INVENTION

Figure 1:
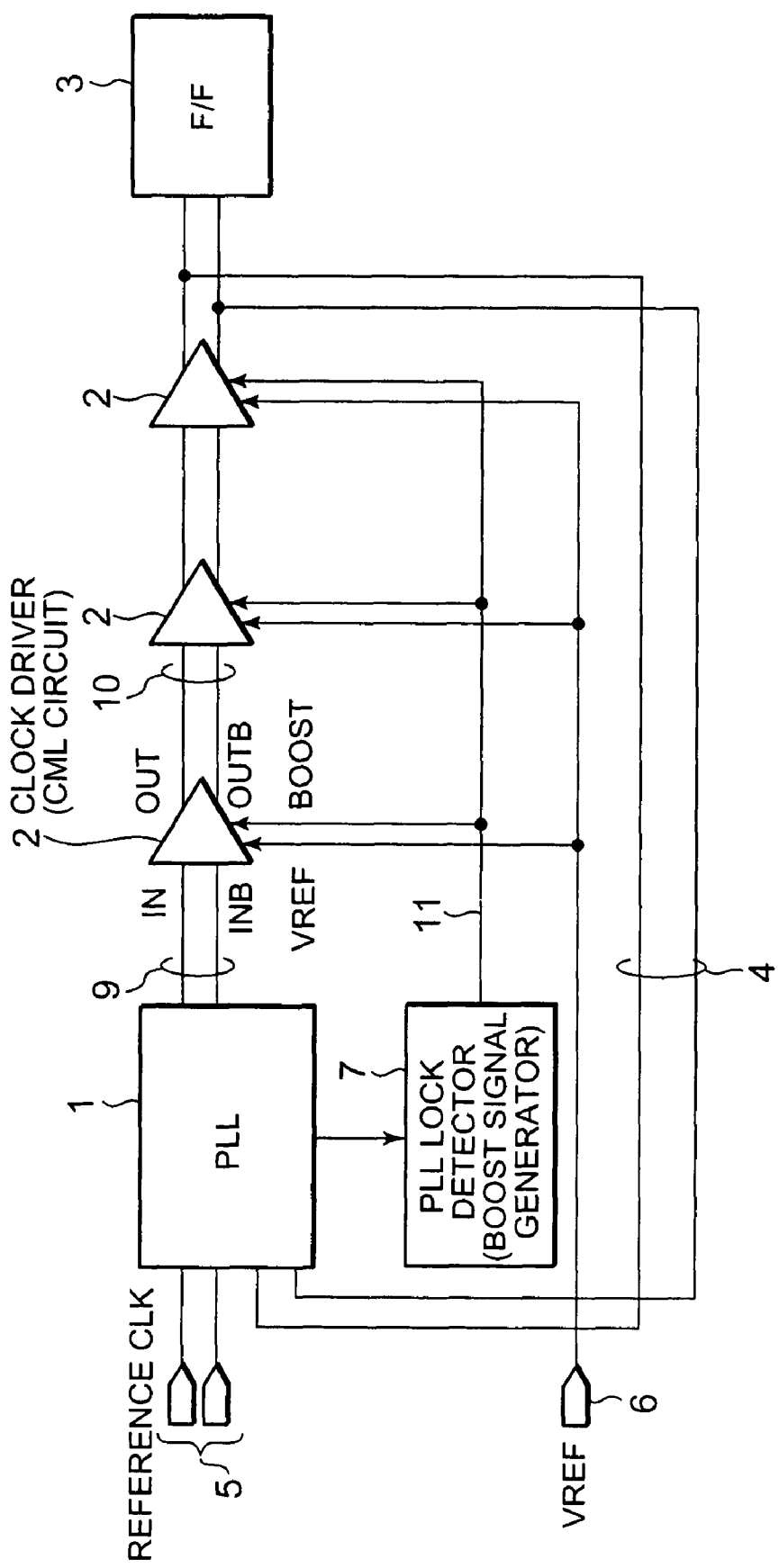
FIG. 1 is a block diagram showing an example of the structure of the clock distributor circuit of the embodiment of this invention.

Now, the exemplary embodiments of this invention are described in detail while referring to the drawings.

Figure 2:
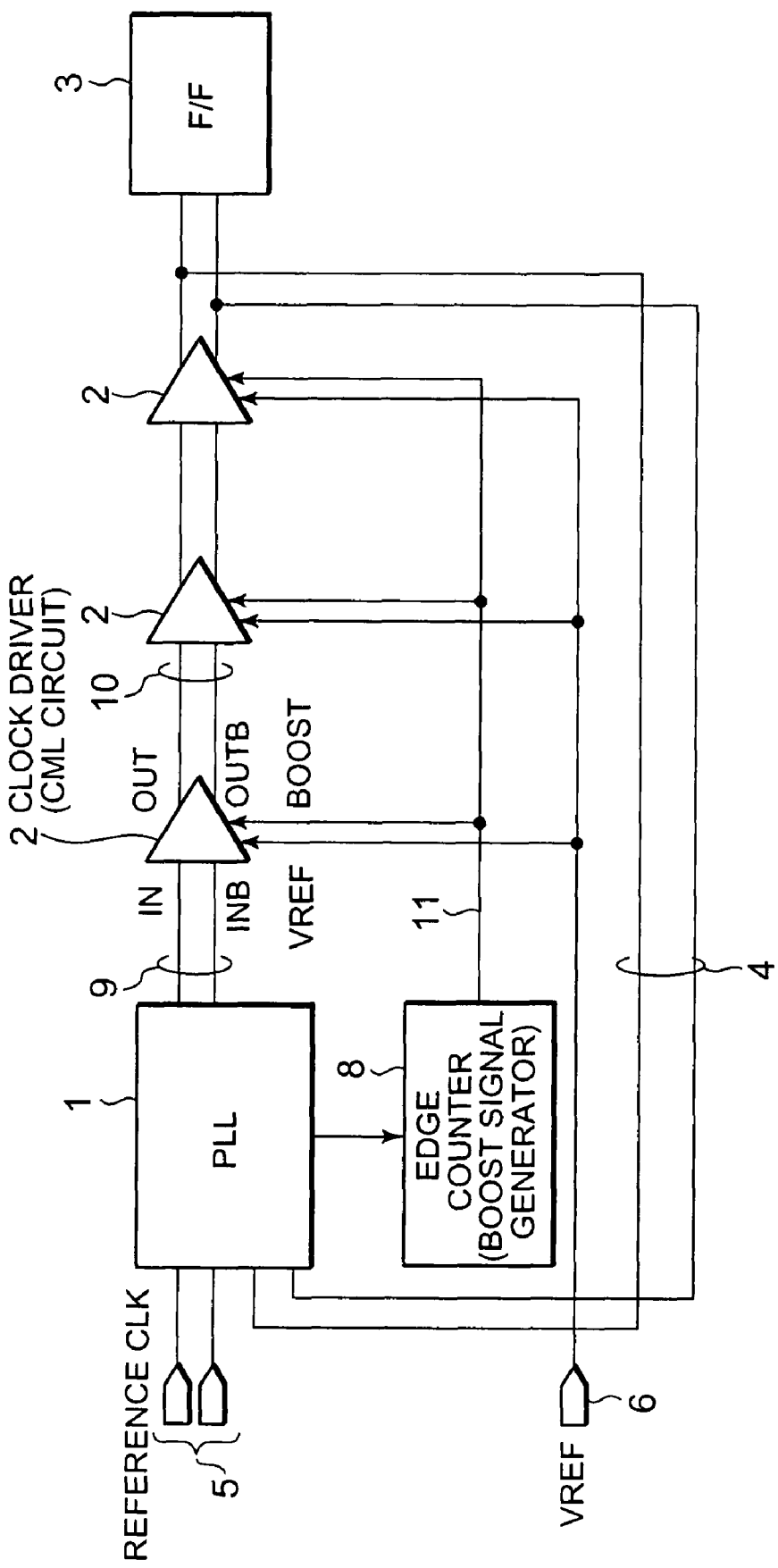
FIG. 2 is a block diagram showing another example of the structure of another clock distributor circuit of the embodiment of this invention.

The entire exemplary structure of this invention is made up of the circuits shown in FIG. 1 or FIG. 2. This exemplary embodiment of the invention activates a boost circuit 12 (FIG. 3) or 23 (FIG. 4) inside the clock driver for a specified time, to temporarily form a state where drive power of the clock driver is high, to prevent losing clock pulses generated in the period when resuming operation from a stopped clock state. Here a clock driver with high drive power means that it is capable of charging up to the load capacitance at high speed by the clock generated from the driver. The driver in other words, is capable of outputting a large electric current (amount of charge per unit of time) when charging up to the load capacitance, and the time required to completely charge the electrical charge or completely discharge it, namely the time to reach a high level or a low level is short.

The clock waveform becomes a periodic waveform when a certain amount of time elapses after resuming operation from a stopped state, and there is no problem even if the boost circuits 12, 23 are turned off causing the drive power lowered to the minimum required state. Therefore, the boost circuits 12, 23 are turned off after a certain time elapses in order to reduce power consumption using a control signal (drive power boost signal) BOOST (11 in the figure). The BOOST signal is generated utilizing a counter (8 in the figure) for counting up to just a pre-specified number of pulse edges from a feedback clock (4 in the figure) or a PLL lock detector circuit (7 in the figure).

Figure 3:
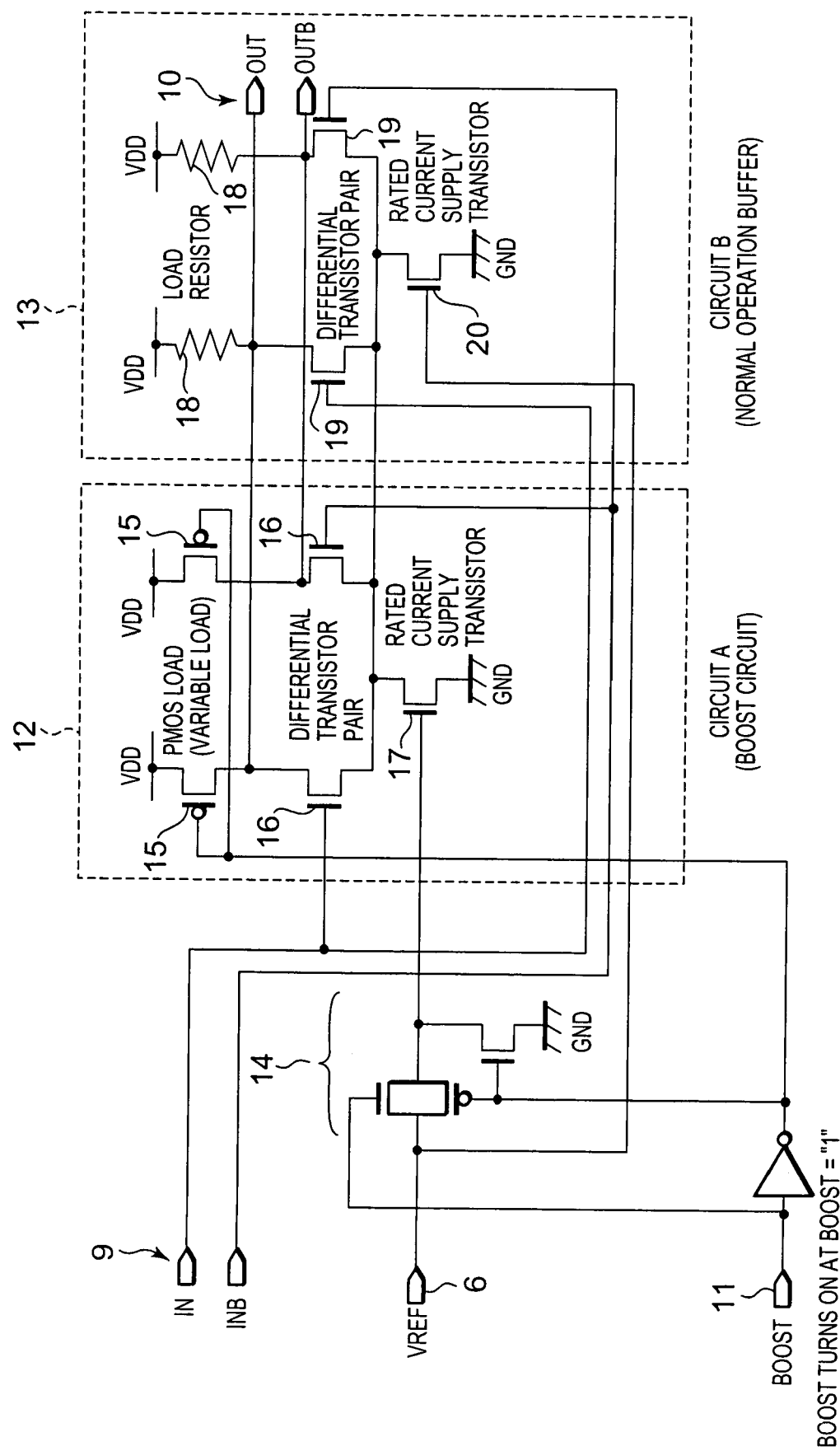
FIG. 3 is a circuit diagram showing an example of the structure of the CML circuit containing the boost function of the embodiment of this invention.
Figure 4:
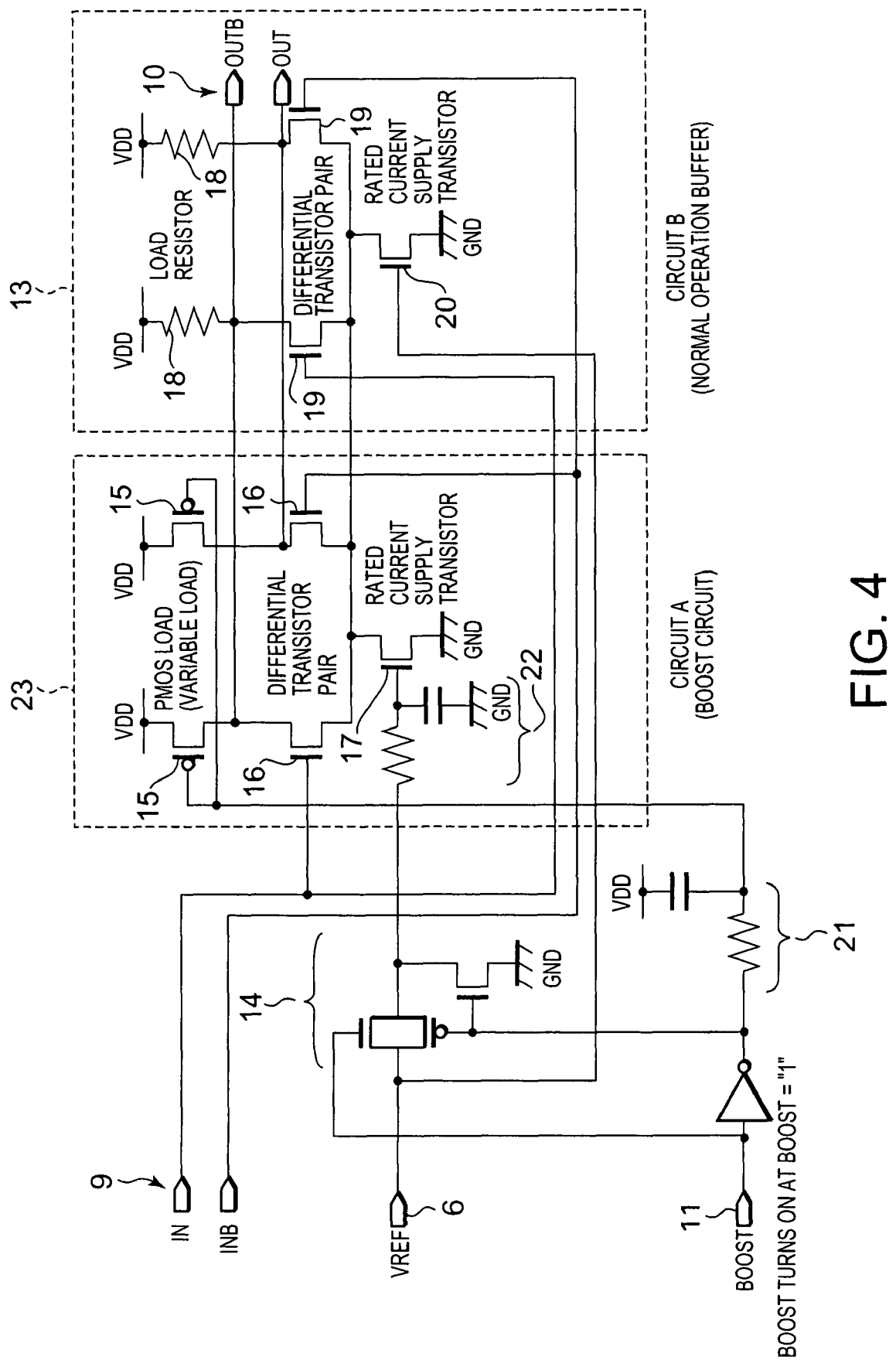
FIG. 4 is a circuit diagram showing another example of the structure of the CML circuit containing the boost function of the embodiment of this invention.

The clock driver 2 is in an inactive state when the reference signal VREF is inactive (low level in FIG. 3 and FIG. 4). The clock driver 2 transitions to the operating state when the reference signal VREF changes to active (high level in FIG. 3 and FIG. 4). However, the clock driver does not immediately reach a steady operation state.

In FIG. 1, the PLL lock detector circuit 7 detects whether the PLL1 is in locked state or not. When the clock driver reaches to a steady operation state and the PLL lock detector circuit 7 decides that the clock output from the clock driver 2 is phase-locked, the PLL lock detector circuit 7 switches the drive power boost signal BOOST from active (to high level in FIG. 3, FIG. 4) to inactive (to low level in FIG. 3, FIG. 4).

In FIG. 2, if the number of clocks output from the clock driver 2 reaches a specified number after the reference signal VREF turns active, then the edge counter 8 switches the drive power boost signal BOOST from active (to high level in FIG. 3, FIG. 4) to inactive (to low level in FIG. 3, FIG. 4).

This exemplary embodiment of the invention is therefore characterized in adding boost circuits 12, 23 to a clock driver 2 utilizing CML circuits, and then dynamically controlling the drive power of the clock driver according to the overall operating state of the clock distribution system including a feedback loop to a PLL.

The clock driver 2 of this exemplary embodiment of the invention contains a circuit A (boost circuits, 12 and 23) of FIG. 3 and FIG. 4; and a circuit B (normal operation buffer, 13). Both the circuits A and B include load resistor pairs (15, 18), differential transistor pairs (16, 19), and rated current supply transistors (17, 20). The rated current supply transistors supply a constant flow of electrical current from the power supply voltage (VDD) to ground (GND). The differential transistor pairs control the ratio between the electrical current flowing to the left load resistor and the electrical current flowing to the right load resistor according to the input waveform. The load resistors generate an output clock whose voltage amplitude varies according to the electrical current flowing in the load resistors.

The circuit A is a CML circuit utilizing a PMOS (Positive MOS) as a load resistor (15). The gate voltage of the PMOS 15 is controlled to change the load resistance of the applicable PMOS 15 and then to turn the boost circuits 12, 23 on and off.

When the drive power boost signal BOOST is active (high level), the PMOS 15 operates as a load resistor. When the drive power boost signal BOOST is inactive (low level), then the PMOS 15 is in a high impedance state.

In the same way, when the drive power boost signal BOOST is active (high level), the NMOS 17 operates as a current source. When the drive power boost signal BOOST is inactive (low level), then the NMOS 17 is in a high impedance state.

The circuit A therefore operates as a CML circuit in the same way as circuit B when the drive power boost signal BOOST is active (high level) and functionally is a drive power amplifier means. On the other hand, when the circuit A is inactive (low level), it does not function as a power amplifier means, and a portion of the current drawn from the rated current supply (transistor) 20 flows into the differential transistor pair 16.

The circuit B on the other hand, is a CML circuit with a resistor device (18) functioning as the load. Its resistor value is bias-independent and is not easily susceptible to the effects of power supply fluctuations, so is utilized during normal operation to reduce clock jitter.

During boost, the product of the electrical current flowing from the rated supply 17 of circuit A and the resistance value of PMOS load 15 is adjusted to equal the product of the electrical current flowing from the rated supply 20 of circuit B and the resistance value of load resistor 18 so that the voltage level output from circuit A is the same as the voltage level of circuit B.

In FIG. 1, the feedback clock pulses return to the PLL1 from just before the flip-flop circuit (F/F in FIG. 3) which receives the clocks. The PLL lock detector circuit 7 compares the feedback clock pulse with the reference clock to decide if the input signal and output signal are phase-locked and determine that clock distribution is stable.

In FIG. 2, the feedback clock pulses return to the PLL1 from just before the flip-flop circuit 3 and the edge counter 8 counts the number of clock edges for the feedback clock 4 to determine if clock distribution is stable. The number of the clock edges to be counted before the determination is predetermined based on the period necessary for the output clock to stabilize. The period is to be studied or measured beforehand.

When the clock distribution is stable, the PLL lock detection circuit 4 (FIG. 1) or the edge counter 8 (FIG. 2) switches the BOOST terminal 11 from 1 (active) to 0 (inactive).

When the BOOST signal is set to "1" (active) both circuits A and B in FIG. 3 and FIG. 4 operate and boost (raise) the drive power.

When the BOOST signal is set to "0" (inactive), the VREF ON/OFF switch 14 sets the gate voltage on current supply source transistor 17 of circuit A to zero (0) volts. The boost circuits 12, 23 consequently turn OFF. The output of the circuits A (boost circuits 12, 23) are set to a high impedance state because the gate voltage of the PMOS load 15 is set to the supply voltage (VDD).

Therefore when the BOOST signal is set to "0", the electrical current from the supply voltage VDD flows to ground (GND) via the differential transistor pair 16, 19 of circuits A, B, and the rated current source transistor 20 of circuit B. As a result the current output decreases and the drivability drops. However, the ratio between the current flowing in the rated current source transistor 17 and the resistance value of the load 15 dose not change and the cross point position of the differential signal is kept same even if boost circuits 12, 23 turn off.

If the clock driver shown in FIG. 3 is contained in a PLL closed loop in FIG. 1 and the boost circuit turns on and off digitally (intermittently) there is a risk of the PLL locked status being lost due to delay in the clock pulse distribution or rapid changes in clock amplitude. To prevent a PLL lock from being lost, integrator circuits 21 and 22 with same RC time constants are preferably provided as shown in FIG. 4, for making the time required for the PMOS load 15 to turn off and the-time required for the current flow source transistor 17 of circuit A to turn off are same. These integrator circuits 21 and 22 with same RC time constants render the effect of smoothly lowering the gate voltage of the rated current supply transistor 17, and smoothly raising the gate voltage of PMOS load 15 to make the distribution delay and amplitude change smoothly and consecutively, and therefore lower the risk of the PLL lock being lost.

Figure 5:
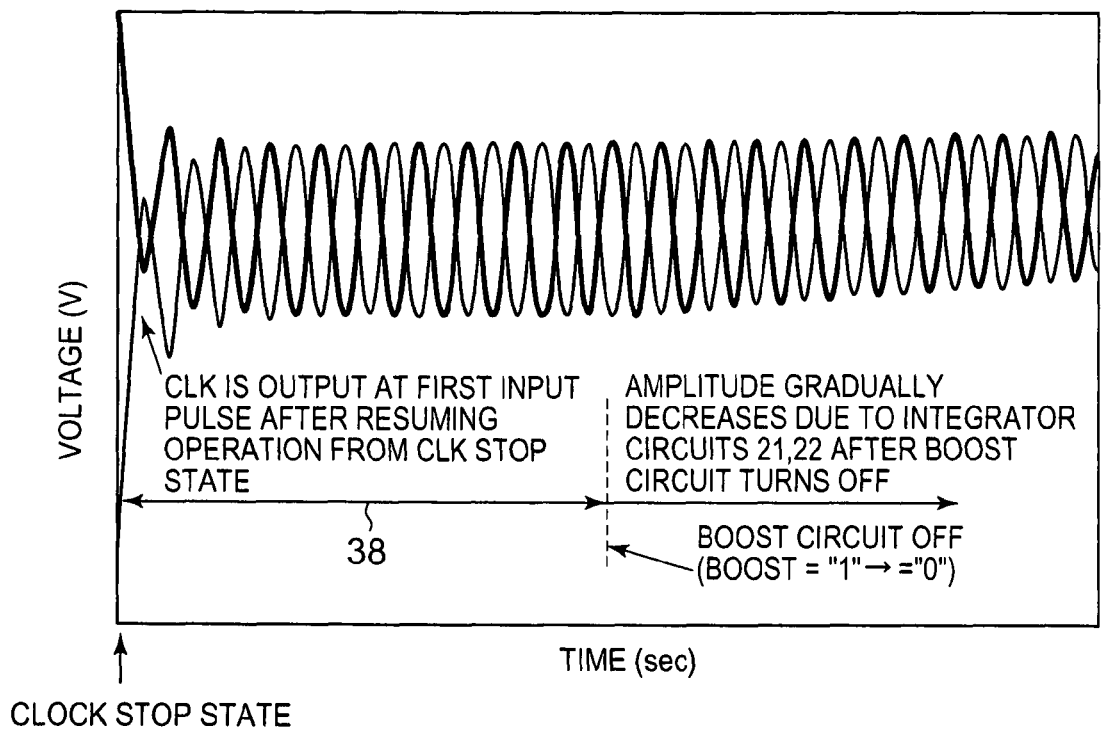
FIG. 5 is a drawing showing the clock signal waveform when using the CML circuit containing the boost function of the embodiment of this invention.
Figure 6:
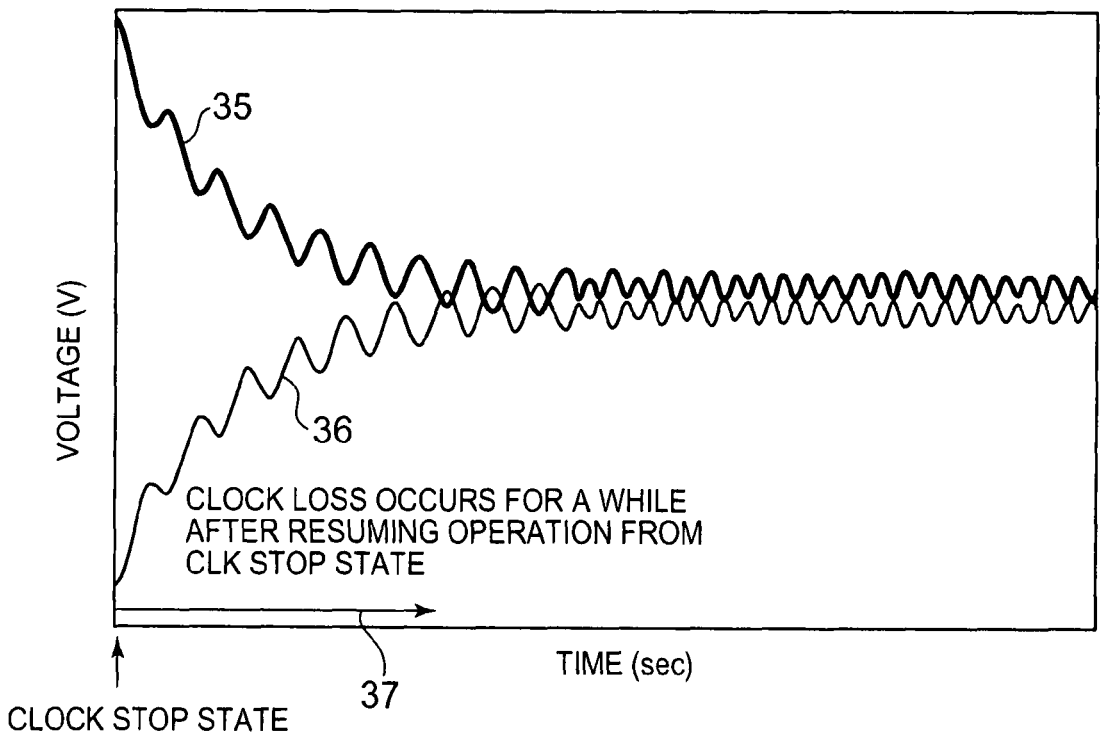
FIG. 6 is a drawing showing the clock signal waveform when not using the CML circuit containing the boost function of the embodiment of this invention.

FIG. 5 and FIG. 6 are drawings showing results comparing the circuits of FIG. 3 and FIG. 4 in the simulation to illustrate the effect of this exemplary embodiment of the invention.

An RC circuit and a next-stage driver were added as a load to the output of the clock driver 2, and the clock signal input to the next-stage driver are measured. FIG. 5 shows the result for the clock driver 2 with a boost circuit A (drive power amplifier means) of this exemplary embodiment of the invention and FIG. 6 shows the result for the clock driver 2 without a boost circuit A of this exemplary embodiment of the invention.

FIG. 6 also shows the simulation results for the clock distributor circuit employing a clock driver with equivalent drive power of the clock driver in FIG. 4 with boost circuit A off.

Operation from a stopped clock state begins with the input, capacitance of the next stage clock driver and the clock wiring fully charged. Therefore, a period 37 occurs in which the signals input into IN and INB of the next stage clock driver, namely the differential clock signals 35, 36 cannot cross due to insufficient driver power and the clock waveform is lost.

If the clock distribution circuit employs a driver with large drive power in order to avoid occurrence of the period 37 in FIG. 6, the power consumption drastically increases. A fixed current constantly flows from the power supply to ground in CML circuit, regardless of whether in operation or not.

When there is large inductance from long distance wiring or when the driver possess a large boost or drive power, ringing might occur in the distributed clocks which causes the unstable clock signal logic value, or overshoot might occur which causes the voltage to exceed the transistor ratings and possibly damage the transistor or degrading transistor performance.

On the other hand, if the boost circuit A is turned on and set to a high drive power state, in the fixed period 38 from the start of operation as shown in FIG. 5; and the boost circuit A then turned off and drive power lowered after that fixed period 38 ends, then lost clock waveforms during the start of operation can be prevented and stable operation achieved while reducing power consumption and ringing.

The circuit A in FIG. 3 and FIG. 4 utilized a PMOS resistor load 15; however, any type component may be used if the load resistor value can be varied.

The circuit B in FIG. 3 and FIG. 4 utilized a load resistor 18 as the resistor element. However, the same effect can be achieved by utilizing an inductance or a combination of inductance and resistor element.

In FIG. 1 and FIG. 2, the reference clock 5 and the feedback clock 4 for making inputs to the PLL are both differential signals using two signal lines; however, the feedback clock 4 may be changed to a single-end type and compared with a single-end reference clock.

In FIG. 1 and FIG. 2, the circuits 7, 8 for outputting the boost signal are placed in the vicinity of the PLL1 but these circuits may be positioned elsewhere. Moreover, these may be internal circuits within the PLL1. These circuits may also be directly controlled from outside, for example by a timer outside the PLL1.

In FIG. 1 and FIG. 2, the driver was made up of three stages from the clock driver 2 to the F/F 3; however, any number of driver stages may be used.

In FIG. 1 and FIG. 2, the clock drivers were serially connected in a 1:1:1 configuration but may also be connected in a tree configuration of 1:n1:n2.

In FIG. 1 and FIG. 2, the VREF 6 was distributed in common to all clock drivers however the VREF 6 may be generated for each clock driver separately.

In FIG. 3 and FIG. 4, the VREF ON/OFF switch 14 circuit was installed internally in each clock driver 2, however the switch 14 may be installed outside the clock driver 2.

The boost circuit A may be set not to operate if measurement of the clock frequency shows that the clock frequency is below a specified frequency. This embodiment provides a clock distribution circuit including a CML circuit capable of suppressing power supply drops by lowering the clock driver drive power (boost) during the low-speed LSI test.

In this exemplary embodiment of the invention a device capable of controlling resistance value and amount of electrical current such as a bipolar transistor may be substituted for the MOS transistors (15 through 17 and 20) in FIG. 3 and FIG. 4. Here, if utilizing a bipolar transistor, then the high level voltage that is input may be set as GND (ground) potential, and the low level voltage may be set as a negative (minus) voltage.

Moreover, the VREF on/off switch 14 need not be the above structure, and may be any structure capable of switching the voltage between the VREF voltage and GND voltage.

As described above, this exemplary embodiment of the invention includes a drive power boost signal generator for generating a drive power boost signal; and a drive power amplifier for boosting the load drive power when the drive power boost signal is active, so that the drive power can be increased in the specified period after resuming operation from a stopped clock state, and the drive power can be decreased after that specified period elapses.

What is claimed is:

1. A clock distribution circuit, comprising:
 a drive power boost signal generator which outputs a drive power boost signal; and
 a current mode logic (CML) circuit which outputs a first signal combined with a second signal when the drive power boost signal indicates an active state and outputs the first signal when the drive power boost signal indicates an inactive state,
 wherein the CML circuit comprises:
  a normal operation circuit which outputs the first signal according to an input signal regardless of a state which the drive power boost signal indicates; and
  a boost circuit which outputs the second signal according to the input signal when the drive power boost signal indicates the active state but does not output the second signal when the drive power boost signal indicates the inactive state, and
 wherein:
  the drive power boost signal generator outputs a drive power boost signal indicating an active state for a period after the normal operation circuit changes to an operation state from a stop state, and outputs a drive power boost signal indicating an inactive state after the period.

2. The clock distribution circuit according to claim 1, further comprising a phase-locked loop (PLL) circuit wherein:
 the drive power boost signal generator comprises a PLL lock detector which decides that the period has elapsed by detecting a phase lock in the output signal from the PLL circuit.

3. The clock distribution circuit according to claim 1, wherein the drive power boost signal generator comprises an edge counter which decides the period has elapsed by counting a predetermined number of clock signals.

4. The clock distribution circuit according to claim 1, wherein the boost circuit comprises:
 a differential transistor pair;
 a variable resistor load pair connected to the differential transistor pair; and
 a rated current transistor connected to both the differential transistors and changes a current flow in the rated current transistor and the variable resistor load pair corresponding to changes of the drive power boost signal.

5. The clock distribution circuit according to claim 1, wherein when the drive power boost signal changes from an inactive state to an active state or from an active to inactive state, the boost circuit consecutively changes the amplitude of the second output signal.

6. The clock distribution circuit according to claim 5, wherein the boost circuit comprises:
   a differential transistor pair, a variable resistor load pair connected to the differential transistor pair, a rated current transistor connected to the differential transistor pair, a first resistor connected to the variable resistor load pair and a second resistor connected to the rated current transistor; and
   wherein the boost circuit changes the gate voltage applied to the variable resistor load pair via the first resistor and changes the gate voltage applied to the rated current transistor via the second resistor, so that electrical current flowing through the variable resistor load pair and electrical current flowing through the rated current transistor stop simultaneously.

7. The clock distribution circuit according to claim 6, wherein the drive power boost signal generator sets the drive power boost signal to the inactive state when an operation clock frequency of the CML circuit is below a predetermined frequency.

8. A clock distribution circuit comprising:
   means for outputting a drive power boost signal; and
   means for outputting a first signal combined by a second signal, comprising:
      means for outputting the first signal according to an input signal regardless of a state which the drive power boost signal indicates; and
      means for outputting the second signal according to the input signal when the drive power boost signal indicates active state, but not outputting the second signal when the drive power boost signal indicates an inactive state,
   wherein:
   the means for outputting the drive power boost signal outputs a drive power boost signal indicating an active state for a period after the means for outputting the first signal changes to an operation state from a stop state, and outputs a drive power boost signal indicating an inactive state after the period.

9. A current mode logic (CML) circuit which outputs a first signal combined with a second signal when a drive power boost signal indicates an active state, and outputs the first signal when the drive power boost signal indicates an inactive state, said CML circuit comprising:
   a normal operation circuit which outputs the first signal according to an input signal regardless of a state which the drive power boost signal indicates; and
   a boost circuit which outputs the second signal according to the input signal when the drive power boost signal indicates the active state, and does not output the second signal when the drive power boost signal indicates the active state,
   wherein:
   the drive power boost signal indicates an active state for a period after the normal operation circuit sets to an operation state after a stop state, and indicates an inactive state after the period.

10. The CML circuit according to claim 9, wherein the drive power boost signal indicates an active state until a phase lock is detected in the output signal of a PLL circuit which supplies an input signal to the CML circuit, but indicates an inactive state after the phase lock is detected.

11. The CML circuit according to claim 9, wherein the drive power boost signal indicates the active state until a predetermined number of clock signals is counted, and the drive power boost signal indicates the inactive state after the predetermined number of clock signals is counted.

12. The CML circuit according to claim 9, wherein the boost circuit comprises:
    a differential transistor pair;
    a variable resistor load pair connected to the differential transistor pair; and
    a rated current transistor connected to both the differential transistors and changes the current flow in the rated current transistor and the variable resistor load pair corresponding to changes of the drive power boost signal.

13. The CML circuit according to claim 9, wherein when the drive power boost signal changes between the inactive state and the active state, the boost circuit consecutively changes the amplitude of the second output signal.

14. The CML circuit according to claim 13, wherein the boost circuit comprises:
    a differential transistor pair;
    a variable resistor load pair connected to the differential transistor pair;
    a rated current transistor connected to the differential transistor pair;
    a first resistor connected to the variable resistor load pair; and
    a second resistor connected to the rated current transistor,
    wherein the boost circuit changes a gate voltage applied to the variable resistor load pair via the first resistor, and the boost circuit changes the gate voltage applied to the rated current transistor via the second resistor so that electrical current flowing through the variable load resistor pair and electrical current flowing through the rated current transistor stop simultaneously.

15. A current mode logic (CML) circuit which outputs a first signal combined with a second signal, said CML circuit comprising:
    means for outputting the first signal according to an input signal regardless of a state which a drive power boost signal indicates; and
    means for outputting the second signal according to the input signal when the drive power boost signal indicates an active state, and not outputting the second signal when the drive power boost signal indicates an inactive state,
    wherein:
    the drive power boost signal indicates an active state for a period after the means for outputting the first signal sets to an operation state after a stop state, and indicates an inactive state after the period.

16. A clock distribution method comprising:
    outputting a drive power boost signal;
    outputting a first signal combined with a second signal;
    outputting the first signal according to an input signal regardless of a state which the drive power boost signal indicates; and
    outputting the second signal according to the input signal when the drive power boost signal indicates an active state, and not outputting the second signal when the drive power boost signal indicates an inactive state,
    wherein;
    the outputting of the power boost signal outputs a drive power boost signal indicating an active state for a period after the normal operation circuit changes to an operation state from a stop state, and outputs a drive power boost signal indicating an inactive state after the period.

17. A clock distribution circuit, comprising:

a drive power boost signal generator which outputs a drive power boost signal; and a current mode logic (CML) circuit which outputs a first signal combined with a second signal when the drive power boost signal indicates an active state and outputs the first signal when the drive power boost signal indicates an inactive state, wherein the CML circuit includes a predetermined level of a signal from the combination of the first and second signals to form a temporary state for a predetermined time according to providing a high state for a drive power of a clock driver without losing clock pulses generated during a period when resuming operation from a stopped clocked state.

18. A clock distribution circuit, comprising:

a drive power boost signal generator which outputs a drive power boost signal; and a current mode logic (CML) circuit which outputs a first signal combined by a second signal when the drive power boost signal indicates an active state and outputs the first signal when the drive power boost signal indicates an inactive state, wherein the drive power boost signal generator outputs a drive power boost signal indicating an active state for a period after a first part of the CML circuit changes to an operation state from a stop state, and the drive power boost signal generator outputs a drive power boost signal indicating an inactive state after the period.

19. A clock distribution circuit, comprising:

a drive power boost signal generator which outputs a drive power boost signal; and a current mode logic (CML) circuit which outputs a first signal combined with a second signal when the drive power boost signal indicates an active state and outputs the first signal when the drive power boost signal indicates an inactive state, wherein the CML circuit comprises a normal operation circuit which outputs the first signal according to an input signal regardless of a state which the drive power boost signal indicates, and wherein the drive power boost signal generator outputs a drive power boost signal indicating an active state for a period after the normal operation circuit changes to an operation state from a stop state.

* * * * *